United States Patent [19]

Kirkman

[11] Patent Number: 5,793,104
[45] Date of Patent: Aug. 11, 1998

[54] APPARATUS FOR FORMING ELECTRICAL CONNECTIONS BETWEEN A SEMICONDUCTOR DIE AND A SEMICONDUCTOR PACKAGE

[75] Inventor: Scott Kirkman, San Jose, Calif.

[73] Assignee: LSI Logic Corporation, Milpitas, Calif.

[21] Appl. No.: 608,679

[22] Filed: Feb. 29, 1996

[51] Int. Cl.⁶ .................................................. H01L 23/48
[52] U.S. Cl. ........................... 257/692; 257/704; 257/734
[58] Field of Search ................................ 257/704, 691, 257/692, 734, 693

[56] References Cited

U.S. PATENT DOCUMENTS

| | | | |
|---|---|---|---|
| 4,417,392 | 11/1983 | Ibrahim et al. | 29/840 |
| 4,901,136 | 2/1990 | Neugebauer et al. | 357/75 |
| 4,954,878 | 9/1990 | Fox et al. | 357/81 |
| 5,012,323 | 4/1991 | Farnworth | 357/75 |
| 5,095,359 | 3/1992 | Tanaka et al. | 357/74 |
| 5,220,195 | 6/1993 | McShane et al. | 257/666 |
| 5,223,741 | 6/1993 | Bechtel et al. | 257/678 |
| 5,237,204 | 8/1993 | Val | 257/698 |

FOREIGN PATENT DOCUMENTS

| | | | |
|---|---|---|---|
| 63-44733 | 2/1988 | Japan | 257/704 |
| 2-192743 | 7/1990 | Japan | 257/704 |

Primary Examiner—Tom Thomas
Assistant Examiner—Roy Potter
Attorney, Agent, or Firm—Katz & Cotton, LLP

[57] ABSTRACT

A semiconductor device package containing a semiconductor die uses a platform mounted on an active face of the die. The platform electrically connects to at least one bond pad on the die. A package lid electrically connects to the platform on the die and a package case connection. The package case connection is also electrically connected to at least one external connector on the package. The platform and package lid thereby connect the at least one bond pad on the die to the at least one external connector on the package. Using the platform and lid for electrical connections from the semiconductor die bond pads to the external package connector reduce the number of bond fingers required to surround the perimeter of the die. The package lid and platform may, for example, be used for ground or power connections to the die bond pads.

17 Claims, 19 Drawing Sheets

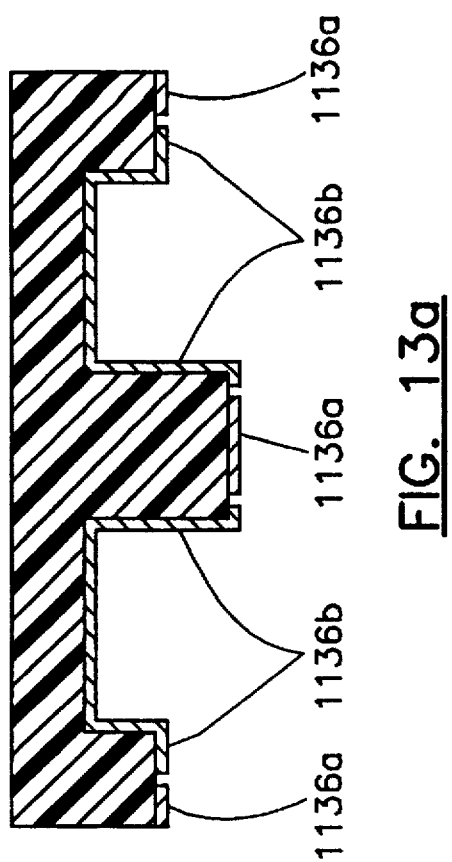

APPARATUS FOR FORMING ELECTRICAL CONNECTIONS BETWEEN A SEMICONDUCTOR DIE AND A SEMICONDUCTOR PACKAGE

BACKGROUND OF THE INVENTION

1. Field of the Invention

The present invention relates generally to semiconductor packages, and, more particularly, to a method and apparatus for electrical connection of a semiconductor die in a semiconductor package using the package lid.

2. Description of the Related Technology

In order to facilitate handling and connection of a semiconductor die to external systems, a common practice in the semiconductor industry is to package the die. Die packaging usually involves mechanically and electrically attaching a die to a package case and sealing the die in or on the package case to form a semiconductor device assembly.

For example, a package case may be constructed from ceramic, printed circuit board (PCB), epoxy laminates, or the like. The package case has a central die receiving area or cavity on one face, and bond fingers or the like located on the package case face surrounding the periphery of the die receiving cavity. A die is centrally mounted in the die receiving cavity and bond pads on the die are electrically connected using bond wires or the like to the respective bond fingers on the package case. The bond fingers exit the package case, and usually terminate in external connectors such as ball bumps, pins or the like (hereinafter external connectors). The external connectors may be located on a single planar surface of the package case. The die receiving cavity may be covered with an encapsulant glob top and/or a package lid, thereby forming a sealed package body around the die and bond wires to minimize potential damage from environmental or mechanical harm. If a package lid is utilized, the package lid is attached to the package case, but the package lid does not physically contact either the die or the bond wires.

In some instances, where the die receiving cavity is on one face of the package case, and the external connectors are on an opposite face of the package case, the completed semiconductor device assembly is referred to as "cavity up ". In other instances, where the die receiving cavity is on the same face of the package case as the external connectors, the completed semiconductor device assembly is referred to as "cavity down ".

FIGS. 1a, 1b, 2 and 3 illustrate typical prior art semiconductor packages. FIGS. 1a, 1b and 3 illustrate "cavity up " construction. FIG. 2 illustrates "cavity down " construction.

Referring now to FIG. 1a, a prior art package case 102 with a mounted semiconductor die 104 is illustrated in schematic top view prior to sealing with a package lid 124 (illustrated in FIG. 1b). The die 104 is centrally located in the die receiving cavity 106 and mounted to the package case 102 using nonconductive epoxy 108 (illustrated in FIGS. 1b). Bond pads 10 are located on the periphery of the active face of the die 104 and have a diameter 112 and center to center distance (hereinafter pad pitch) 114. A number of bond fingers 116, equal to the number of bond pads 110, are disposed on one layer (or tier) of the package case 102 proximate to the respective bond pads 110. The bond fingers 1 16 have a width 1 18 and a center to center distance (hereinafter finger pitch) 120. The finger pitch 120 is measured at the ends of the bond finger 116, located proximate to the die 104. The bond pads 110 are electrically connected in a one to one relationship to the respective bond fingers 116 by bond wires 122. For illustrative clarity, only a few of many such bond pads 110, bond fingers 116 and bond wires 122 are shown.

Referring now to FIG. 1b, a prior art cavity up sealed package body 100 is illustrated in schematic cross-section elevational view. The sealed package body 100 is formed when a package lid 124 is attached to the package case 102 of FIG. 1a thereby sealing the die 104, bond pads 110, bond wires 122, and bond fingers 116 in the die receiving cavity 106. The package lid 124 may be attached to package case 102 using nonconductive epoxy 126. The bond fingers 116 are electrically connected to respective vias 128 which electrically connect to respective traces 130 located on the opposite face of the package case 102. The traces 130 electrically connect the vias 128 to respective external connectors 132.

Referring now to FIG. 2, a prior art cavity down sealed package body 200 is illustrated in schematic cross-section elevational view. Similar to the cavity up sealed package body 100 illustrated in FIG. 1b, a semiconductor die 204 is centrally located in a die receiving cavity 206 in a package case 202. The die 204 is attached to the package case 202 using a nonconductive epoxy 208. Bond pads 210 located on die 204 are electrically connected to bond fingers 216 on the package case 202 using bond wires 222.

The bond fingers 216 are electrically connected to respective vias 228 which, unlike the vias in the cavity up sealed package body 100 illustrated in FIG. 1b, electrically connect to respective traces 230 and respective external connectors 232 located on the same face as the opening to the die receiving cavity 206. A package lid 224 covers the opening of the die receiving cavity 206 and may be attached to the package case 202 using a nonconductive epoxy 226 or the like.

Over the past few years the continuous advance in semiconductor die technology has provided a constant and dramatic increase in the number of circuits (i.e. circuit density) which could be incorporated into a semiconductor die of a given size. As the circuit density of a semiconductor die increases (hereinafter high density die), the number of bond pads on the high density die's active face must also increase. In order for all of the increased number of bond pads to lie near the high density die's periphery for connection to the bond fingers, the bond pad diameter and pad pitch must also be reduced.

In order to package a high density die having an increased number of bond pads, a package case must have a commensurate increase in bond fingers so that the bond pads can be attached in a one to one relationship with the bond fingers. Unfortunately, semiconductor packaging technology has not been able to match the size reductions achieved in semiconductor die technology. Although packaging technology has been able to reduce both bond finger width and finger pitch, finger pitch has proven to be a limiting factor in package case design. Because current semiconductor packaging technology has not been able to reduce finger pitch enough to allow the necessary number of bond fingers to be placed all in the same tier, so that the bond fingers could be attached on a one to one basis with bond pads on a high density die, semiconductor package cases were modified to include two or more tiers of bond fingers placed around and proximate to the periphery of the high density die.

Referring now to FIG. 3, a prior art lidded cavity up semiconductor package body for a high density die is illustrated in schematic cross-section elevational view. Similar to the semiconductor package bodies illustrated in FIGS. 1b and 2, the semiconductor package body 300 has a package case 302 with a centrally located die receiving cavity 306. A high density die 304 is centrally mounted in the die receiving cavity 306 using an epoxy 308. Unlike FIGS. 1b and 2 (though not illustrated the following is equally applicable to both cavity up and cavity down package cases) the package case 302 has a first tier of bond fingers 316a and a second tier of bond fingers 316b to accommodate an increased number of bond pads 310 on the high density die 304.

In all of the foregoing illustrations, a common element is that the bond pads are connected to the bond fingers in a one to one relationship. The one to one relationship is necessary to keep bond wire lengths to a minimum so as to minimize the possibility of the bond wires shorting against one another or breaking. Unfortunately, as the number of semiconductor bond pads increases, so does the number of associated bond fingers, and due to the limitation of bond finger pitch, the solution has been to stagger the deployment of bond fingers into additional tiers surrounding the die, thereby requiring additional bond wires of increasingly unacceptable length.

In addition to causing semiconductor device assemblies to experience catastrophic failures such as bond wire shorting or breaking, unacceptable bond wire length can also reduce or hinder overall performance efficiency of the semiconductor device assembly in several ways. For example, at unacceptable lengths bond wire resistance can become sufficiently large to cause excessive voltage drops between the respective bond pad and bond finger. Further, as the bond wire resistance increases, the possibility exists that the semiconductor die operation may be slowed due to resistive-capacitive delays when the unacceptably long bond wire(s) interact with parasitic capacitances within the semiconductor device assembly.

What is needed is a method and apparatus which will allow an increased number of semiconductor die bond pads to be electrically interconnected to a semiconductor package body while maintaining both a minimum number of required bond fingers and a minimum bond wire lengths in the completed semiconductor device assembly.

SUMMARY OF THE INVENTION

Objects of the Invention

An object of the invention is to create a lidded semiconductor package body which has at least one electrical interconnection between the package lid and an enclosed semiconductor die.

Another object of the present invention is to create a lidded semiconductor package body which has at least two electrical interconnections between the package lid and an enclosed semiconductor die.

A further object is to create a lidded semiconductor package body where all ground interconnections are formed between the package lid and an enclosed semiconductor die.

Another object of the present invention is to create a lidded semiconductor package body where all power interconnections are formed between the package lid and an enclosed semiconductor die.

Yet another object is to create a lidded semiconductor package body where all ground interconnections and all power interconnections are formed between the package lid and an enclosed semiconductor die.

A still further object of the present invention is to create a lidded semiconductor package body where the quantity of required bond fingers on the package case is less than the quantity of required bond pads on an enclosed semiconductor die.

Another object of the present invention is to create a lidded semiconductor package body where the quantity of required bond fingers on the package case are contained on a single bonding tier and at least one electrical interconnection exists between the package lid and an enclosed semiconductor die.

An advantage of the present invention is the ability to connect semiconductor die bond pads to at least one external connector via the package lid in both cavity up and cavity down package bodies.

A novel feature of the present invention is the ability to connect a plurality of semiconductor die bond pads to a lesser quantity of external connectors on the package body.

Another novel feature of the present invention is the ability to connect a plurality of semiconductor die bond pads to a single external connector on the package body.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DISCLOSURE OF THE INVENTION

According to the present invention, the foregoing and other objects, advantages and features are attained by a semiconductor device assembly where the package lid provides at least one electrical connection between at least one semiconductor die bond pad, contained in the package body, to at least one external connector on the exterior of the package body. Because at least one semiconductor die bond pad is electrically connected to at least one package body external connector by the package lid, the semiconductor die can have at least one more bond pad than there are bond fingers in the semiconductor device assembly. Preferably many bond pads on the semiconductor die are electrically connected to one or more external connections via the package lid.

Using the package lid in this manner reduces the number of bond fingers which must be placed in the package body, surrounding the semiconductor die, and electrically connected to the remaining semiconductor bond pads. As the number of required bond fingers is reduced, the requirement for or the number of staggered tiers is reduced, thereby reducing the maximum length of the bond wires needed to connect the bond fingers to the remaining semiconductor bond pads. If there is only a single tier of bond fingers, as the number of required bond fingers is reduced, the ends of the bond fingers can be moved closer to the semiconductor die while still maintaining a constant bond finger pitch, thereby further reducing the maximum length of the bond wires needed to connect the bond fingers to the remaining bond pads.

A preferred embodiment of the semiconductor device assembly comprises a package case, a semiconductor die, a platform, and a package lid. The package case has a die receiving area, one or more tiers of bond fingers, at least one conductive case pattern, and two or more external connectors. The die receiving area is preferably centrally located in the package case. The die receiving area is encircled by and proximate to the one or more tiers of bond fingers, which is further encircled by the at least one conductive case pattern. The at least one conductive case pattern is connected to one or more of the external connectors, and the bond fingers are connected to the other remaining external connectors.

The semiconductor die is attached to the package case at the die receiving area. The semiconductor has an active face opposite to its face attached at the die receiving area, and the active face has a number of bond pads located toward the periphery of the die.

The platform is attached centrally to the active face of the semiconductor die such that the platform is encircled by and proximate to the semiconductor bond pads. One or more of the bond pads on the semiconductor die are electrically connected to the platform. The remaining bond pads are electrically connected to the bond fingers on the package case.

Finally, the package lid is electrically connected to both the platform and the at least one conductive pattern on the package case. The package lid thus completes the electrical connection between the one or more bond pads connected to the platform and the external connectors connected to the at least one conductive case pattern.

According to another aspect of the invention, the platform has at least one conductive platform pattern, and the lid has at least one conductive lid pattern. The platform is attached centrally to the active face of the semiconductor die such that the platform is encircled by and proximate to the semiconductor bond pads and the at least one conductive platform pattern is opposite the semiconductor die active face. One or more of the bond pads on the semiconductor die are electrically connected to the at least one conductive platform pattern. The at least one conductive lid pattern is electrically connected to both the at least one conductive platform pattern and the at least one conductive pattern on the package case. The at least one conductive package pattern thus completes the electrical connection between the one or more bond pads connected to the at least one conductive platform pattern and the external connectors connected to the at least one conductive case pattern.

According to another aspect of the invention, the case has two or more electrically isolated conductive case patterns, the platform has two or more electrically isolated conductive platform patterns, and the lid has two or more electrically isolated conductive lid patterns. Each of the conductive case patterns is connected to one or more of the external connectors, and each of the conductive platform patterns is connected to one or more of the semiconductor die bond pads. Finally, Each one of the conductive lid patterns is connected to one conductive platform pattern and one conductive case pattern, thus completing two or more electrical connections between the semiconductor die and the external connectors on the package case using the package lid.

According to another aspect of the invention, at least one of the electrical connections formed between the package lid, or a conductive lid pattern, and the at least one conductive case pattern also servers the dual function of mechanically sealing the package lid to the package case, thus sealing the semiconductor die, the platform, all of the conductive patterns, all of the bond fingers, and all bond wires inside the package body, and protecting same from external mechanical and environmental harms.

According to another aspect of the invention, the external connections on the package case preferably are in a cavity up configuration, wherein the external connections to both the bond fingers and the one or more conductive case pattern(s) are located on a face of the case opposite the face defining the die receiving area.

In accordance with another aspect of the invention, the external connections on the package case may be in a cavity down configuration, wherein the external connections to both the bond fingers and the one or more conductive case pattern(s) are located on the same face of the case which also defines the die receiving area.

According to another aspect of the invention, the platform and/or the lid are fabricated from an electrically conductive metal. Here the conductive case pattern only consists of a single case pattern.

According to another aspect of the invention, one or more of the semiconductor bond pads are connected to a platform pattern which is in electrical communication with at least one external connector which is connected to an external system ground.

According to another aspect of the invention, one or more of the semiconductor bond pads are connected to a platform pattern which is in electrical communication with at least one external connector which is connected to an external system power source.

According to another aspect of the invention, the lid surface and the conductive lid pattern(s) are planar. Here the conductive case pattern(s) and a central portion of the conductive platform pattern(s) are in substantially the same plane.

According to another aspect of the invention, the lid surface is contoured so that a platform attachment area and a case attachment area are projected out of the plane of the package lid so that the conductive lid pattern(s) are nonplanar. Here the conductive platform pattern(s) are substantially planar, the conductive case pattern(s) are substantially planar, and the conductive platform pattern(s) and the conductive case pattern(s) are substantially coplanar.

According to another embodiment of the invention, the external connections on the semiconductor device assembly are in a cavity down configuration. Here the semiconductor die bond pads connected to the platform are further connected to the package lid which has external connectors on the package lid. The remaining semiconductor die bond pads connected to the bond fingers are further connected to the external connectors on the package case. Because the package lid has external connectors, the package lid is only mechanically attached to the package case, and the case does not have a conductive case pattern. The package lid external connectors are proximate to and coplanarly or planarly positioned with the package case external connectors.

Other and further objects, features and advantages will be apparent from the following description of the presently preferred embodiments of the invention, given for the purpose of disclosure and taken in conjunction with the accompanying drawings.

BRIEF DESCRIPTION OF THE DRAWINGS

FIG. 7a is schematic cross-section elevational view of the package lid illustrated in FIG. 5 taken along the Line 7a—7a;

FIG. 13a is a schematic cross-section elevational view of the package lid illustrated in FIG. 11 taken along the Line 13a—13a;

DETAILED DESCRIPTION OF PREFERRED EMBODIMENTS

Figure 1A:
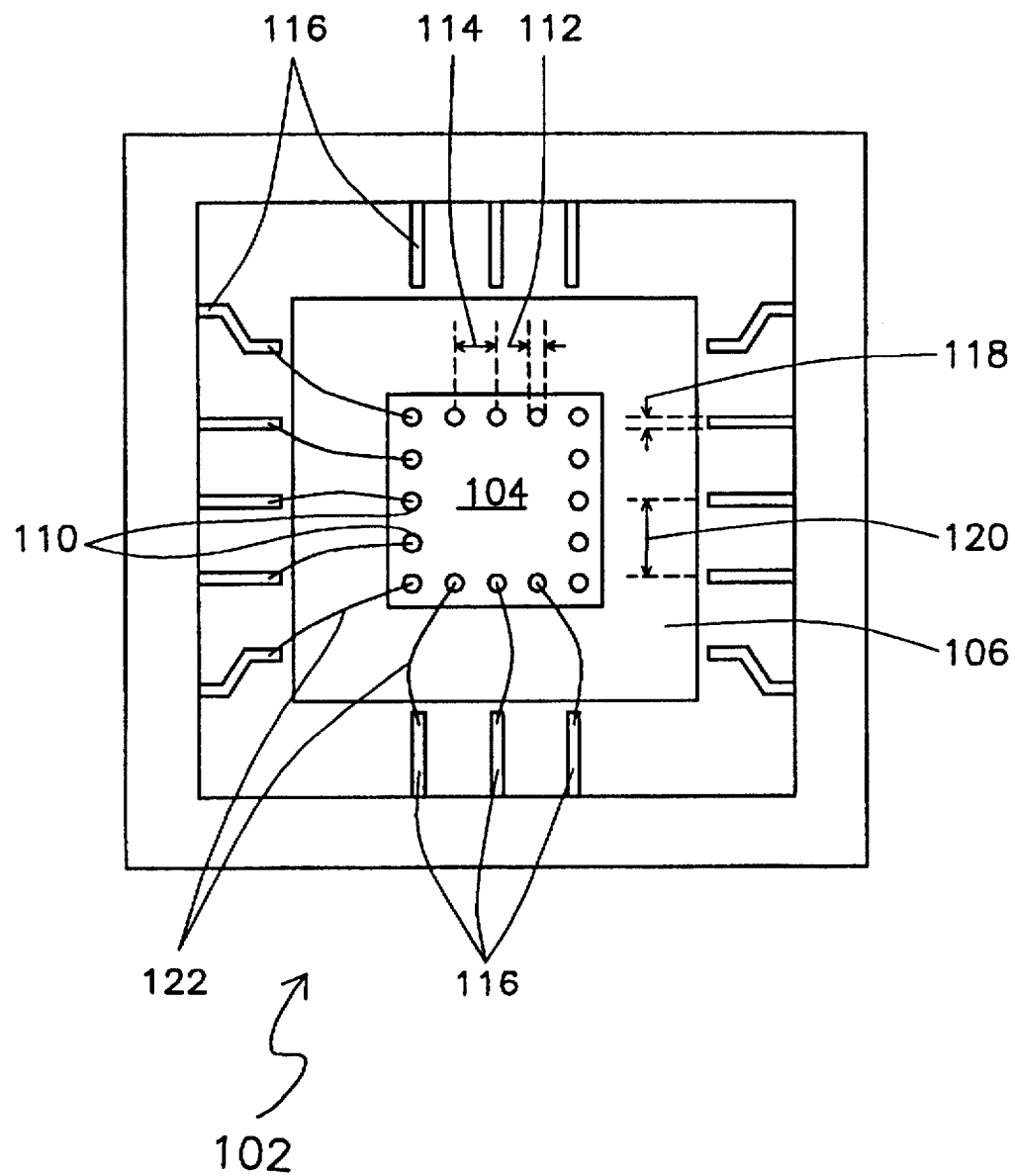
FIG. 1a is schematic top view of a prior art semiconductor package case.
Figure 1B:
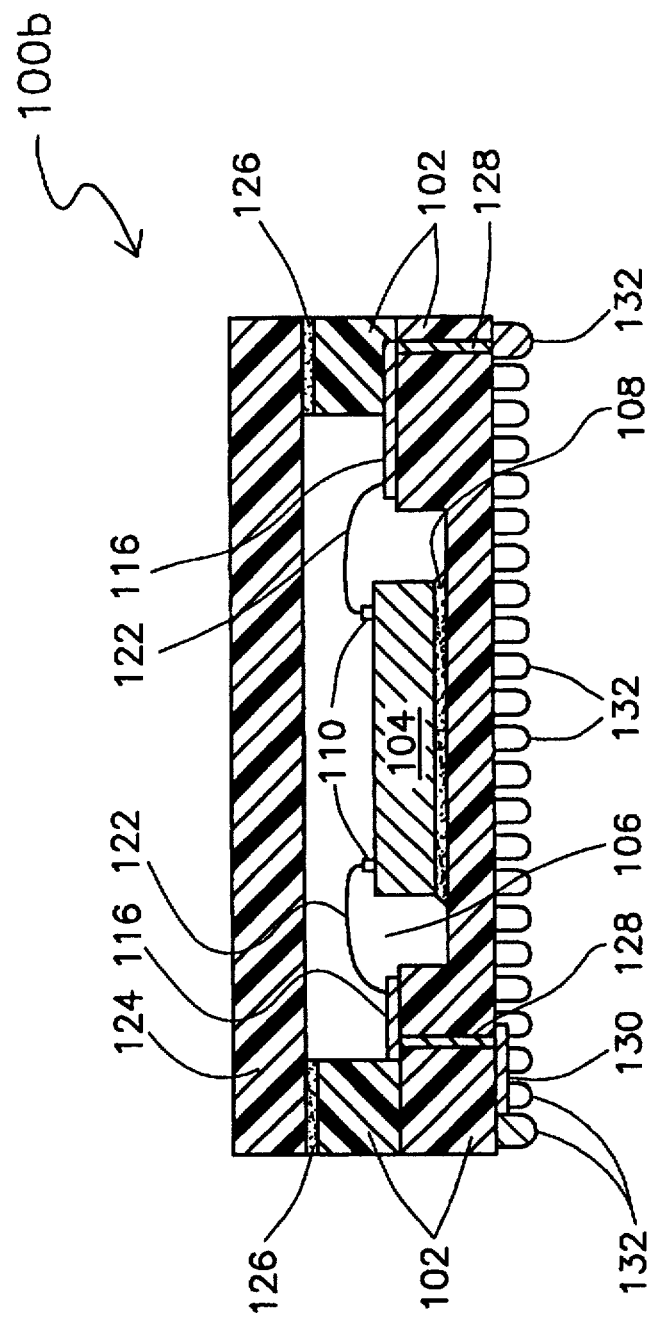
FIG. 1b schematic cross-section elevational view of a prior art semiconductor package.
Figure 2:
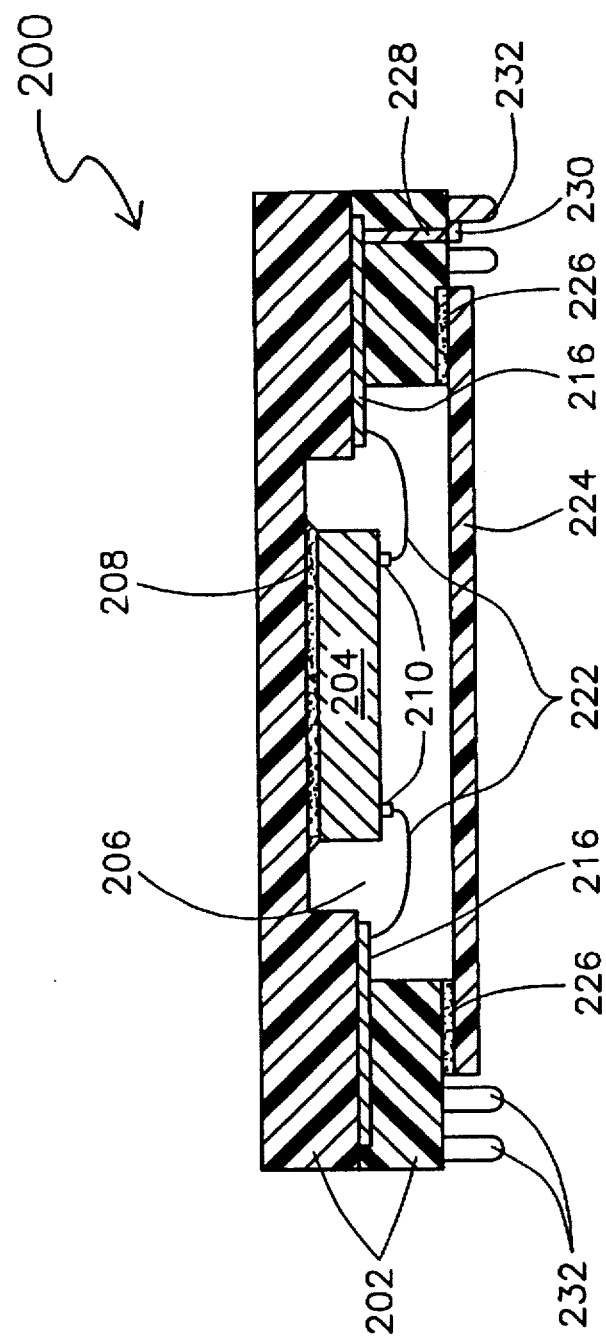
FIG. 2 is schematic cross-section elevational view of a prior art semiconductor package.
Figure 3:
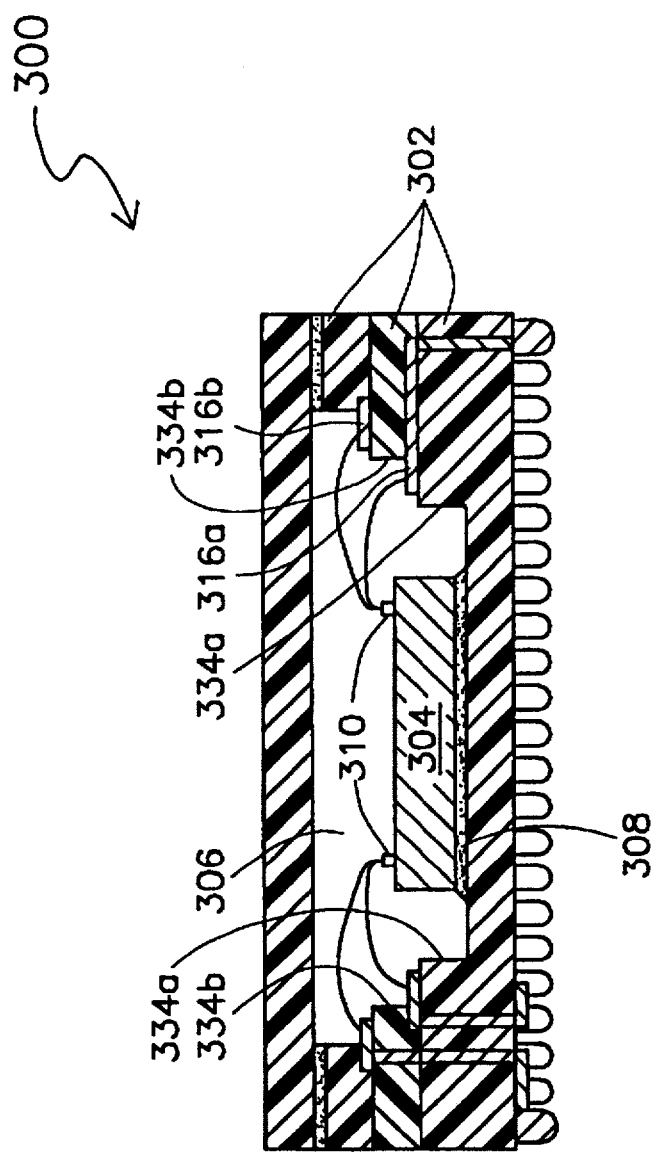
FIG. 3 is schematic cross-section elevational view of a prior art semiconductor package.

A better understanding of the present invention will be obtained when the following detailed description is read with reference to the drawings. In the drawings like elements are numbered the same, and similar elements are represented by the same number and a different lower case letter suffix.

Figure 4:
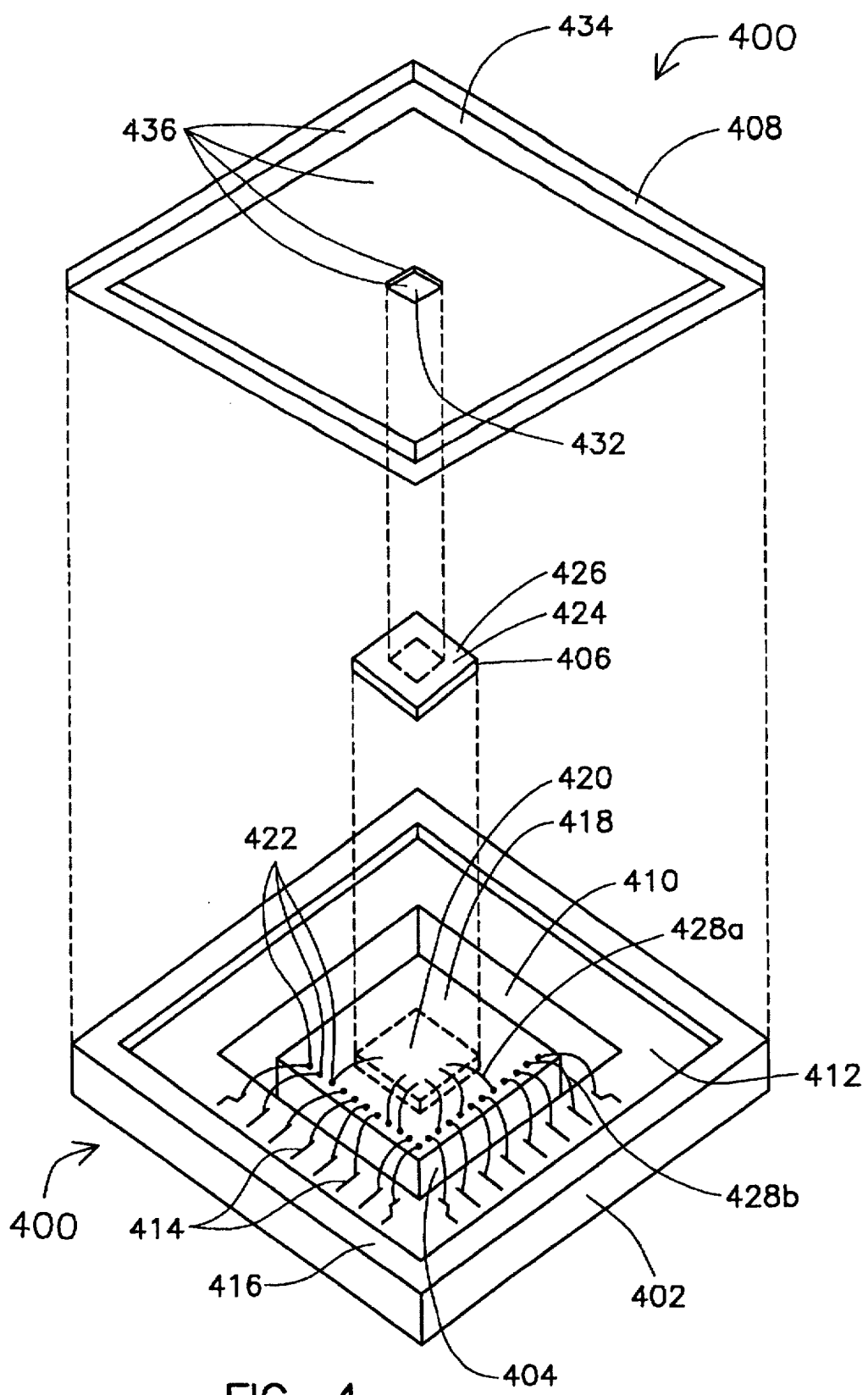
FIG. 4 is a schematic exploded perspective view of an embodiment of the present invention.
Figure 5:
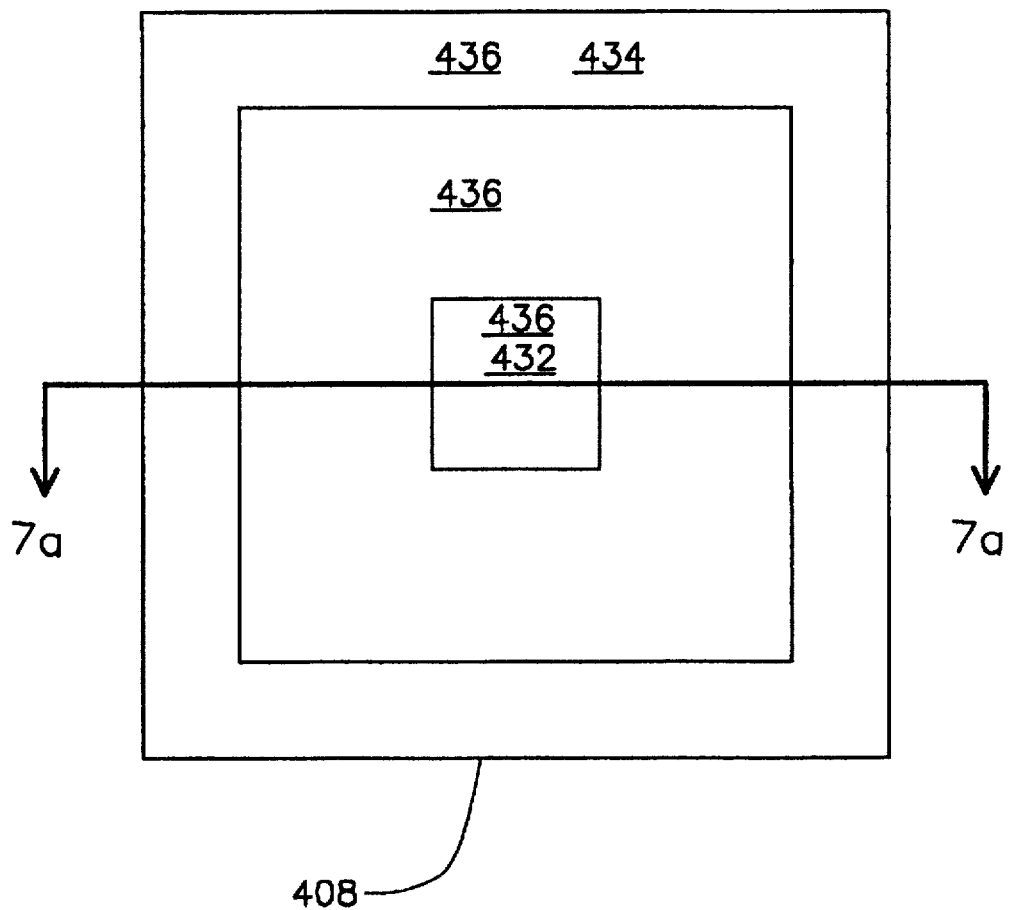
FIG. 5 is schematic bottom view of the package lid illustrated in FIG. 4.
Figure 6:
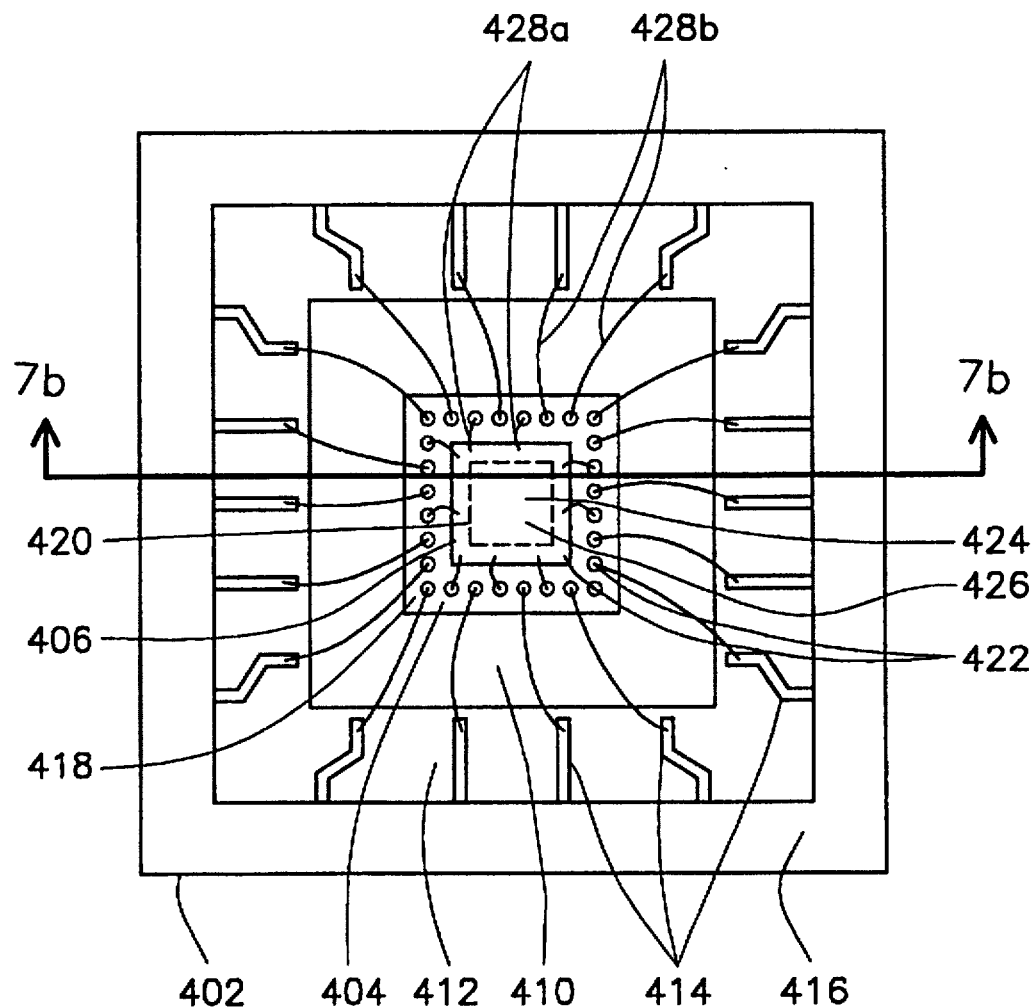
FIG. 6 is a schematic top view of the package case with die and platform illustrated in FIG. 4.
Figure 7A:
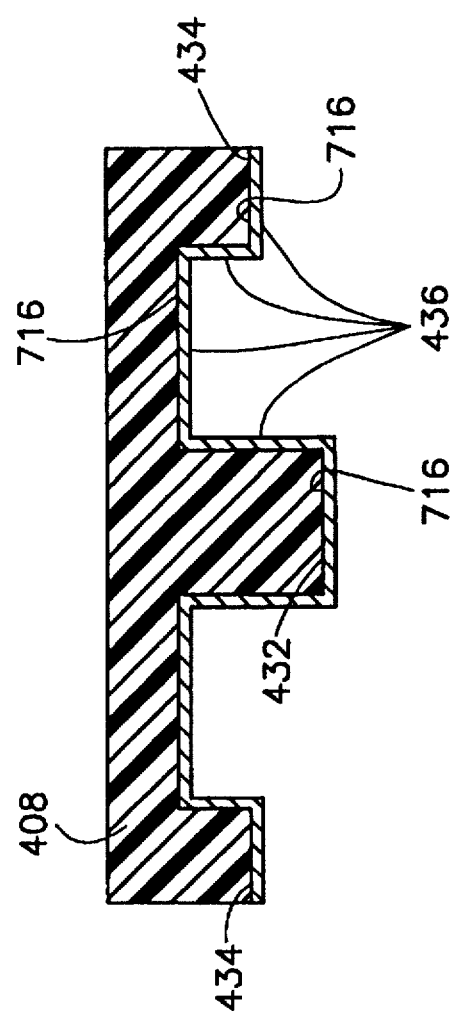
Figure 7B:
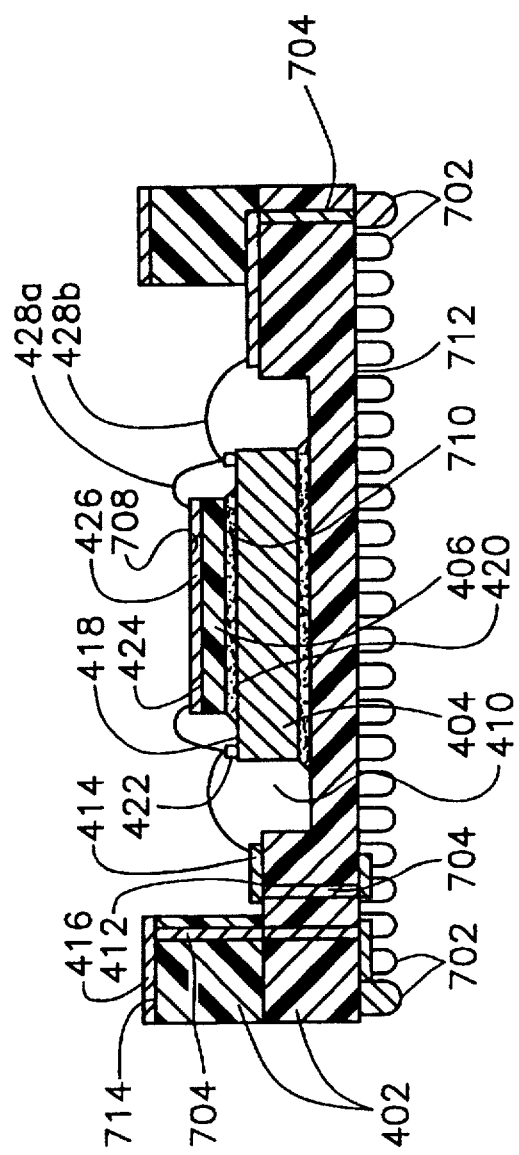
FIG. 7b is a schematic cross-section elevational view of the package case with die and platform illustrated in FIG. 6 taken along the Line 7b—7b.
Figure 8:
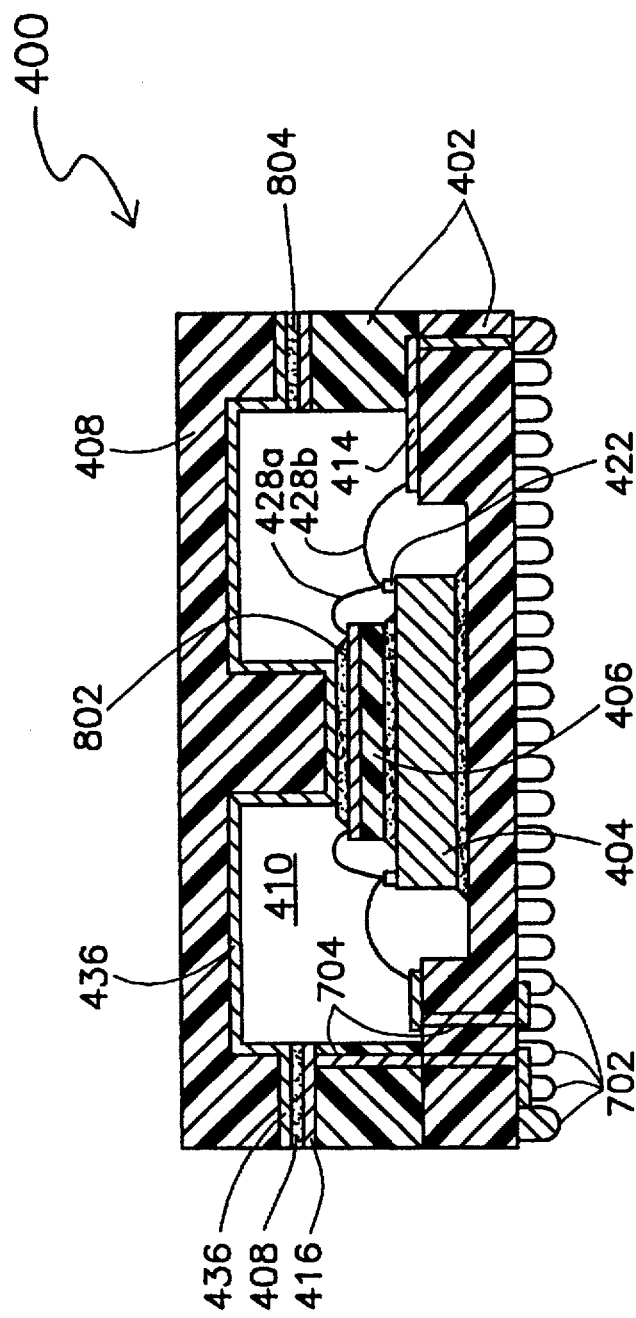
FIG. 8 is schematic cross-section elevational view of the apparatus illustrated in FIGS. 7a and 7b after sealing.

Referring now to FIGS. 4, 5, 6, 7a, 7b and 8, a semiconductor device assembly 400 is illustrated. The semiconductor device assembly 400 comprises four main parts: a package case 402, a semiconductor die 404, a platform 406, and a package lid 408. FIG. 4 illustrates the semiconductor device assembly in schematic exploded perspective view. FIG. 5 illustrates the package lid 408 in schematic bottom view. FIG. 6 illustrates the package case 402, the semiconductor die 404, and the platform 406 in schematic top view. FIG. 7a illustrates the package lid 408 in schematic elevational cross section (taken along line 7a—7a of FIG. 5). FIG. 7b illustrates the package case 402, the semiconductor die 404, and the platform 406 in schematic elevational cross section (taken along line 7b—7b of FIG. 6). FIG. 8 illustrates the semiconductor device assembly 400 in schematic elevational cross section after the package lid 408 in FIG. 7a is attached and electrically connected to the package case 402 and the platform 406 in FIG. 7b.

The package case 402 has a die receiving cavity 410 surrounded by one or more tiers 412 of bond fingers 414 (partially illustrated for clarity), which is further surrounded by one or more conductive case pattern(s) 416. Preferably the die receiving cavity 410 is centrally located in the package case 402. The bond fingers 414 and the conductive case pattern(s) 416 are respectively connected to external connectors 702 (illustrated in FIGS. 7a, 7b and 8) such as pins, solder ball bumps or the like by way of vias 704 (illustrated in FIGS. 7a, 7b and 8), traces or the like. The one or more conductive case pattern(s) 416 are preferably plated metalizations or the like, and most preferably metalizations plated with copper alloys or gold alloys. The package case 402 may be fabricated from ceramic materials, PCB materials, epoxy laminates or the like.

The semiconductor die 404 has an attachment face 706, an active face 418, a platform receiving area 420 located on the active face 418, preferably centrally located on the active face 418, and a plurality of bond pads 422 located peripherally on the active face 418. The semiconductor die attachment face 706 may be attached in the die receiving cavity 410.

The platform 406 has an attachment surface 708 and a substantially coplanar surface 424 with one or more conductive platform pattern(s) 426. The platform attachment surface 708 is fixedly attached to the semiconductor die 404 in the platform receiving area 420, preferably by means of epoxy 710 or the like. The one or more conductive platform pattern(s) 426 are preferably plated metalizations or the like, and most preferably metalizations plated with copper alloys or gold alloys. The platform 406 may be fabricated from ceramic materials, PCB materials, epoxy laminates or the like. The platform 406 may be fabricated from the same or different materials as the package case 402.

One or more of the semiconductor die bond pad(s) 422 are selectively connected to the conductive platform pattern(s) 426 by electrical conductors 428a, and the other die bond pads 422 are selectively connected on a one to one basis to the package case bond fingers 414 by electrical conductors 428b. The electrical conductors 428a and 428b may be formed with wire bonding, tape automated bonding or the like.

The package lid 408 has a lid surface 716, a platform attachment area 432, a case attachment area 434 and one or more conductive lid pattern(s) 436. The platform attachment area 432 is located on the lid surface 716, and preferably is centrally located on the lid surface 716. The case attachment area 434 is peripherally located on the lid surface 716 and surrounds the platform attachment area 432. The one or more conductive lid pattern(s) 436 are disposed on the lid surface 716 and are partially located in the platform attachment area 432 and partially located in the case attachment area 434, each conductive lid pattern 436 contiguously electrically connecting a portion of the platform attachment area 432 to the case attachment area 434. The one or more conductive lid pattern(s) 436 are preferably plated metalizations or the like, and most preferably metalizations plated with copper alloys or gold alloys. The package lid 408 may be fabricated from ceramic materials, PCB materials, epoxy laminates or the like. The package lid 408 may be fabricated from the same or different materials as the package case 402 and/or the platform 406.

The lid surface 716 and the one or more conductive lid pattern(s) 436 encloses the die receiving cavity 410 without electrically or mechanically contacting the semiconductor die 404, the bond fingers 414, or the electrical conductors 428a and 428b therebetween. The one or more conductive lid pattern(s) 436 in the platform attachment area 432 are electrically connected to the respective one or more conductive platform pattern(s) 426. The one or more conductive lid pattern(s) 436 in the case attachment area 434 are electrically connected to the respective one or more conductive case patterns 416, thus completing the electrical connection(s) between the one or more semiconductor bond pads 422 connected to the platform pattern(s) 426 and the one or more external connectors 702 connected to the case pattern(s) 416.

The one or more conductive lid pattern(s) 436 may be electrically connected to the one or more conductive platform pattern(s) 426 by pressure contact, reflowed solder, conductive epoxy or the like, preferably by conductive epoxy 802 as illustrated in FIG. 8. The one or more conductive lid pattern(s) 436 may be electrically connected to the one or more case pattern(s) 416 by reflowed solder, conductive epoxy or the like, preferably by conductive epoxy 804 as illustrated in FIG. 8. The electrical connections between the conductive lid pattern(s) 436 and conductive platform pattern(s) 426 may be the same or different from the electrical connections between the conductive lid pattern(s) 436 and the conductive case pattern(s) 416. The case attachment area 434 (of the package lid 408) is attached to the package case 402 so as to form a hermetic seal which isolates and protects the die receiving cavity, and all items contained therein, from environmental and mechanical harm. Preferably, the electrical connections (such as the conductive epoxy 804) between the lid patterns 436 and the case patterns 416 also form the seal between the package lid 408 and package case 402.

Referring now to FIGS. 7a, 7b and 8 an aspect of the present invention is illustrated. Here the external connectors 702 on the package case 402 are in a cavity up configuration, wherein the external connectors 702 are located on an exterior face 712 of the package case 402 opposite the interior face 714 defining the die receiving cavity 410.

Referring to FIGS. 7a, 7b and 8 another aspect of the present invention is illustrated. Here the lid surface 716 is contoured so that the platform attachment area 432 and the case attachment area 434 are projected out of the plane of the package lid so that the conductive lid pattern(s) 436 are nonplanar. The conductive platform pattern(s) 426 are substantially planar, the conductive case pattern(s) 416 are substantially planar, and the conductive platform pattern(s) 426 and the conductive case pattern(s) 416 are substantially coplanar, thereby facilitating the connection of the conductive lid pattern(s) 436 to the conductive platform pattern(s) 426 and the conductive case pattern(s) 416.

Figure 9:
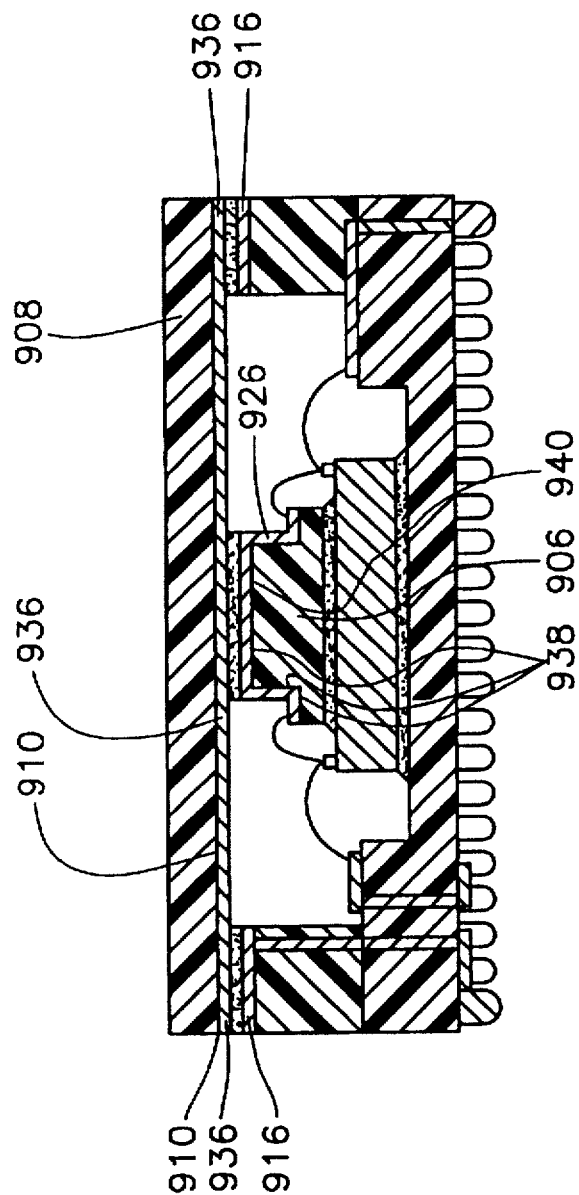
FIG. 9 is a schematic cross-section elevational view of another aspect of the present invention.

Referring now to FIG. 9, another aspect of the invention is illustrated in a cross-section elevational view. Here, the package lid 908, the lid surface 910 and the conductive lid pattern(s) 936 are substantially planar, and the platform 906 has a contoured surface 938. A central portion 940 of the contoured surface 938 is projected out of the plane of the platform 906 so that the conductive platform pattern(s) 926 are nonplanar. The conductive case pattern(s) 916 and the central portion 940 of the conductive platform pattern(s) 926 are in substantially the same plane, thereby facilitating the connection of the conductive lid pattern(s) 936 to the conductive platform pattern(s) 926 and the conductive case pattern(s) 916.

Figure 10:
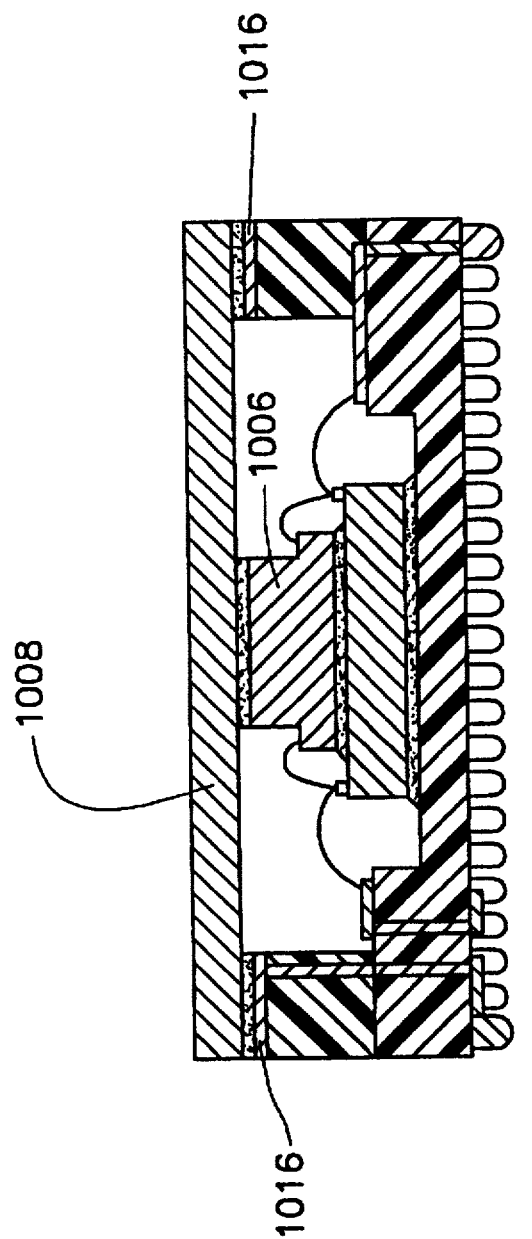
FIG. 10 is a schematic cross-section elevational view of another aspect of the present invention.

Referring now to FIG. 10, another aspect of the invention is illustrated in schematic cross-section elevational view. Here the platform 1006 and/or the package lid 1008 are fabricated from an electrically conductive metal, such as aluminum, copper, gold or the like. The conductive case pattern 1016 consists of a single case pattern.

Referring now to FIGS. 11, 12, 13a, 13b and 14, another embodiment of the present invention is illustrated. Here two distinct sets of semiconductor bond pads may be connected to at least two distinct external connectors on the package case by way of the package lid. In this embodiment one set of bond pads may be selectively connected to an external ground, power source, or signal channel by way of one or more external connectors, and another set of bond pads may be selectively connected to another external ground, power source, or signal channel by way of one or more other external connectors.

Figure 11:
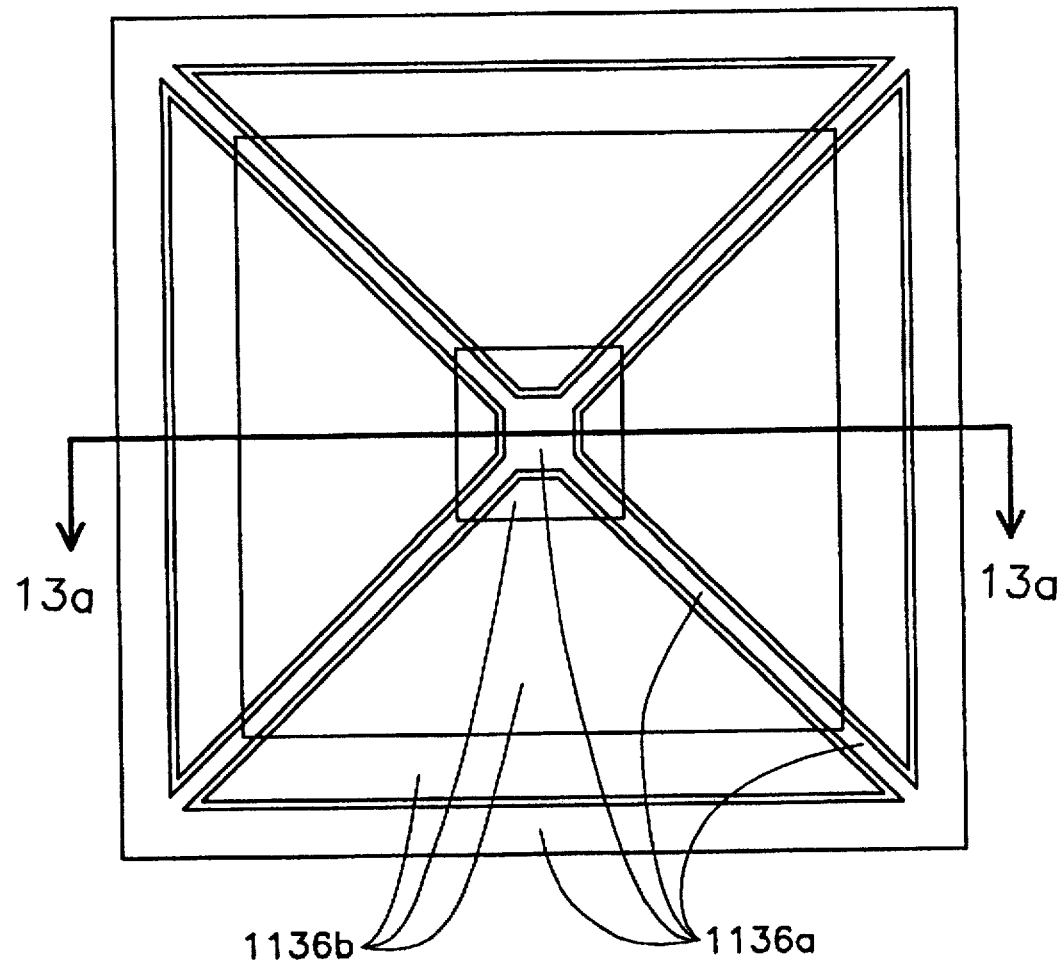
FIG. 11 is a schematic bottom view of an alternate embodiment of the package lid illustrated in FIGS. 4 and 5.
Figure 12:
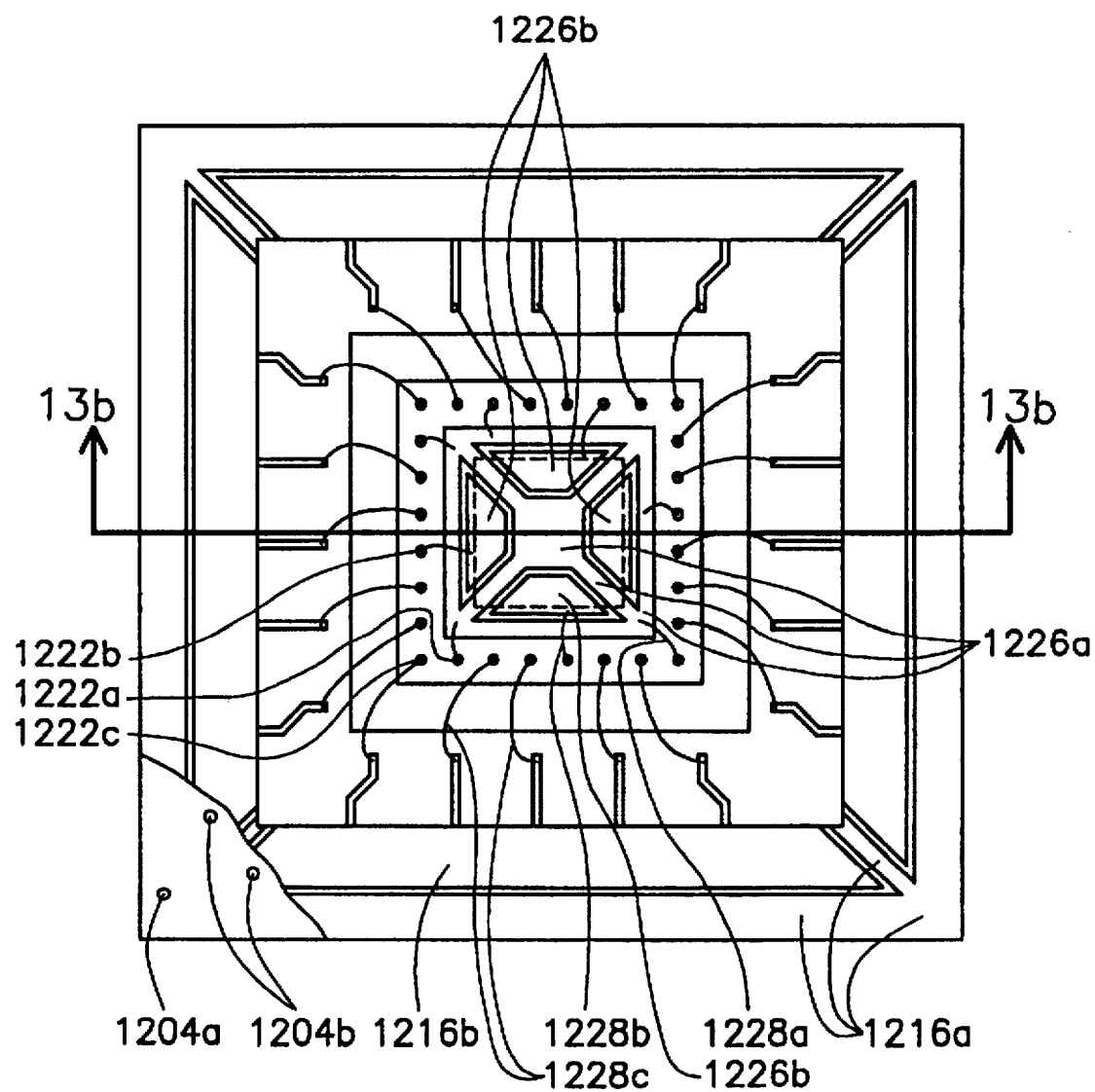
FIG. 12 is a schematic top view of an alternate embodiment of the package case with die and platform illustrated in FIGS. 4 and 6.
Figure 13B:
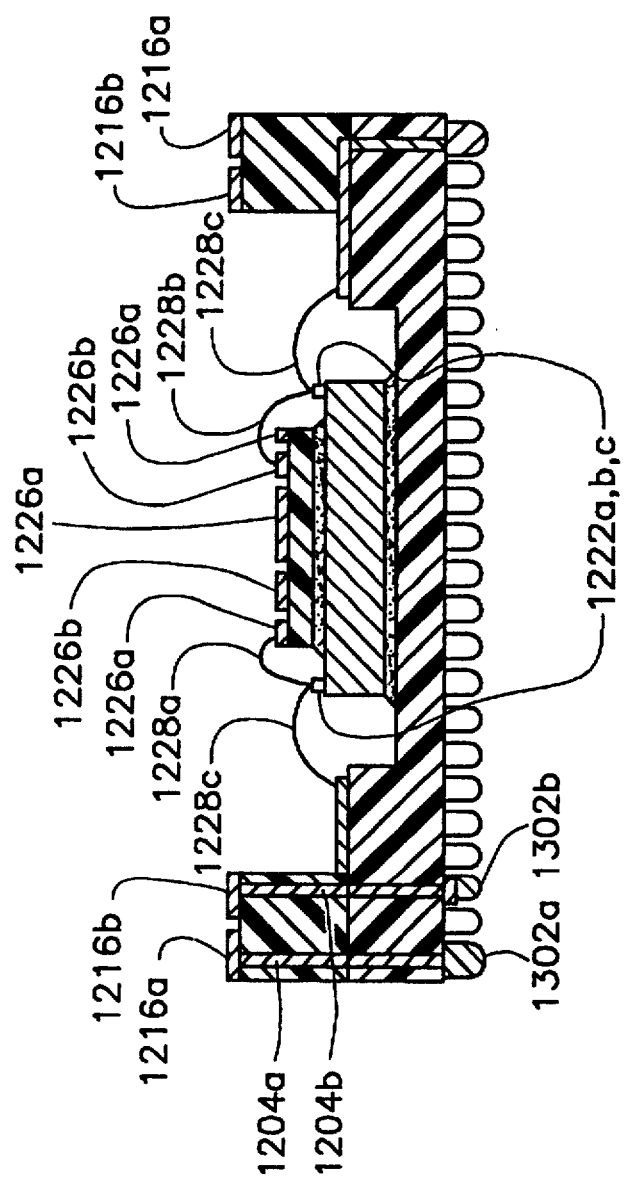
FIG. 13b is a schematic cross-section elevational view of the package case with die and platform illustrated in FIG. 12 taken along the Line 13b—13b.
Figure 14:
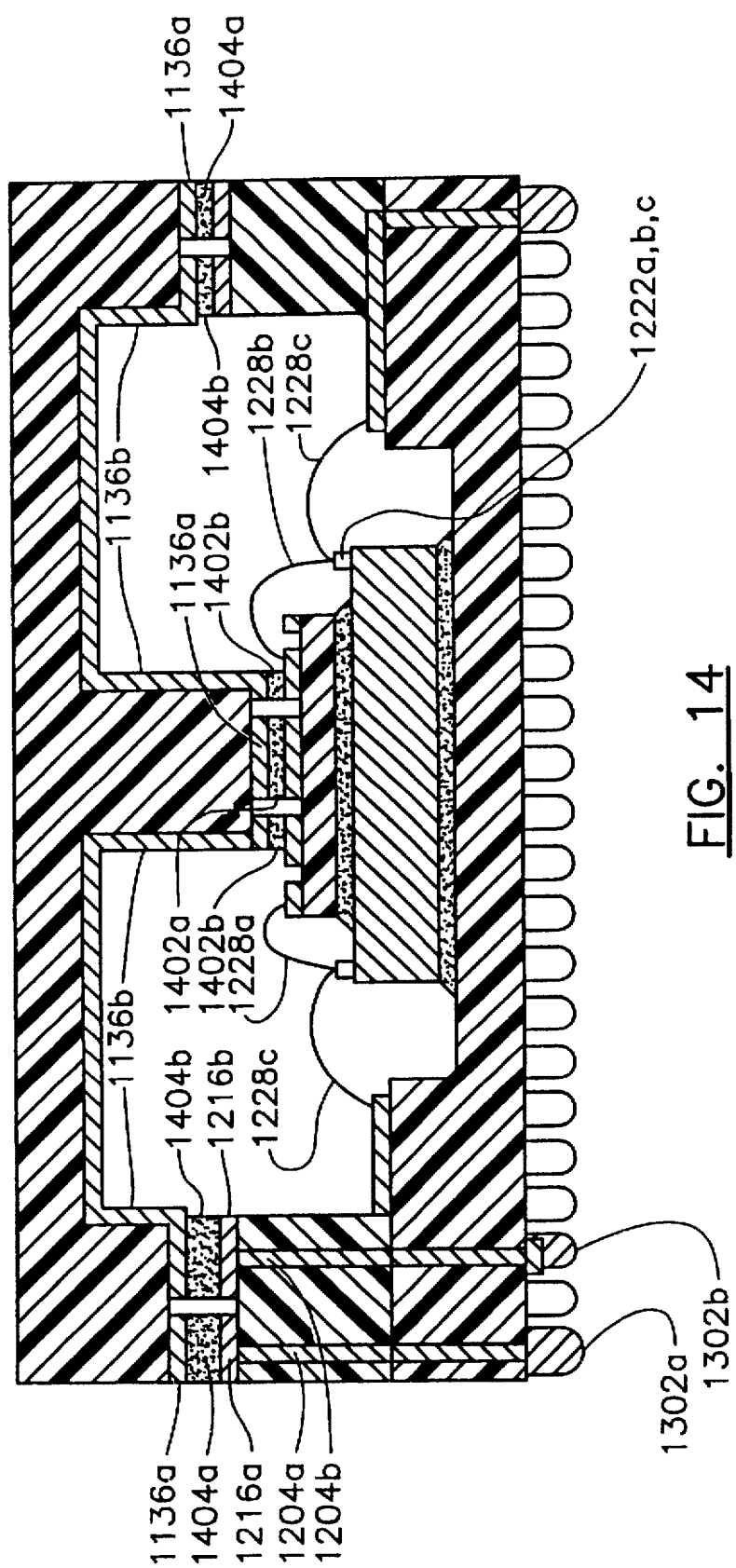
FIG. 14 is a schematic cross-section elevational view of the apparatus illustrated in FIG. 13a and 13b after sealing.

FIG. 11 illustrates in schematic bottom view the package lid 408 of FIG. 4 having two conductive lid patterns 1136a and 1136b. FIG. 12 illustrates in schematic top view the package case 402 having two conductive case patterns 1216a and 1216b, the semiconductor die 404, and the platform 406 of FIG. 4 having two conductive platform patterns 1226a and 1226b. FIG. 13a illustrates the package lid 408 in schematic elevational cross section (taken along line 13a—13a of FIG. 11). FIG. 13b illustrates the package case 402, the semiconductor die 404, and the platform 406 in schematic elevational cross section (taken along line 13b—13b of FIG. 12). FIG. 14 illustrates the semiconductor device assembly 1400 in schematic cross section after the package lid 408 in FIG. 13a is attached and electrically connected to the package case 402 and the platform 406 in FIG. 13b.

The two conductive case pattern(s) 1216a and 1216b are electrically isolated from one another. The case patterns 1216a and 1216b are connected by vias 1204a and 1204b, respectively (illustrated in FIGS. 12, 13b and 14), traces or the like, to external connectors 1302a and 1302b (illustrated in FIGS. 13b and 14) such as pins, solder ball bumps or the like. The two conductive platform patterns 1226a and 1226b (illustrated in FIGS. 12, 13b and 14) are electrically isolated from one another.

One or more of the semiconductor die bond pad(s) 1222a are selectively connected to the conductive platform pattern(s) 1226a by electrical conductors 1228a (illustrated in FIGS. 12, 13b and 14), one or more of the semiconductor die bond pad(s) 1222b are selectively connected to the conductive platform pattern(s) 1226b by electrical conductors 1228b (illustrated in FIGS. 12, 13b and 14), and the remaining other die bond pads 1222c are selectively electrically connected on a one to one basis to the package case bond fingers 414 by electrical conductors 1228c. The bond fingers are further connected to external connectors 702. The electrical conductors 1228a, 1228b and 1228c may be formed with bond wires, tape automated bonding or the like.

The two conductive lid pattern(s) 1136a and 1136b (illustrated in FIGS. 11, 13a and 14) are electrically isolated from one another. The two conductive lid pattern(s) 1136a and 1136b are disposed on the lid surface 716 and are partially located in the platform attachment area 432 and partially located in the case attachment area 434, each conductive lid pattern 1136a and 1136b contiguously electrically connecting a portion of the platform attachment area 432 to the case attachment area 434.

Referring now to FIG. 14, the lid surface 716 and the two conductive lid patterns 1136a and 1136b enclose the die receiving cavity 410 without electrically or mechanically contacting the semiconductor die 404, the bond fingers 414, or the electrical conductors 1228a, 1228b and 1228c therebetween. The two conductive lid patterns 1136a and 1136b in the platform attachment area 432 are electrically connected to the respective two conductive platform patterns 1226a and 1226b. The two conductive lid pattern(s) 1136a and 1136b in the case attachment area 434 are electrically connected to the respective two conductive case patterns 1216a and 1216b, thereby completing the electrical connection(s) between the one or more semiconductor bond pads 1222a and 1222b respectively connected to the platform pattern(s) 1226a and 1226b and the one or more external connectors 1302a and 1302b respectively connected to the case pattern(s) 1216a and 1216b.

The two conductive lid patterns 1136a and 1136b may be electrically connected to the respective two conductive platform patterns 1226a and 1226b by pressure contact, reflowed solder, conductive epoxy or the like, preferably by conductive epoxy 1402a and 1402b as illustrated in FIG. 14. The two conductive lid patterns 1136a and 1136b may be electrically connected to the two case patterns 1216a and 1216b by reflowed solder, conductive epoxy or the like, preferably by conductive epoxy 1404a and 1404b as illustrated in FIG. 14. The case attachment area 434 (of the package lid 408) is attached to the package case 402 so as to form a hermetic seal which isolates and protects the die receiving cavity 410, and all items contained therein, from environmental and mechanical harm. Preferably, the electrical connections (such as the conductive epoxy 1404a) between the lid pattern 1136a and the case patterns 1216a also form the seal between the package lid 408 and package case 402.

Figure 15:
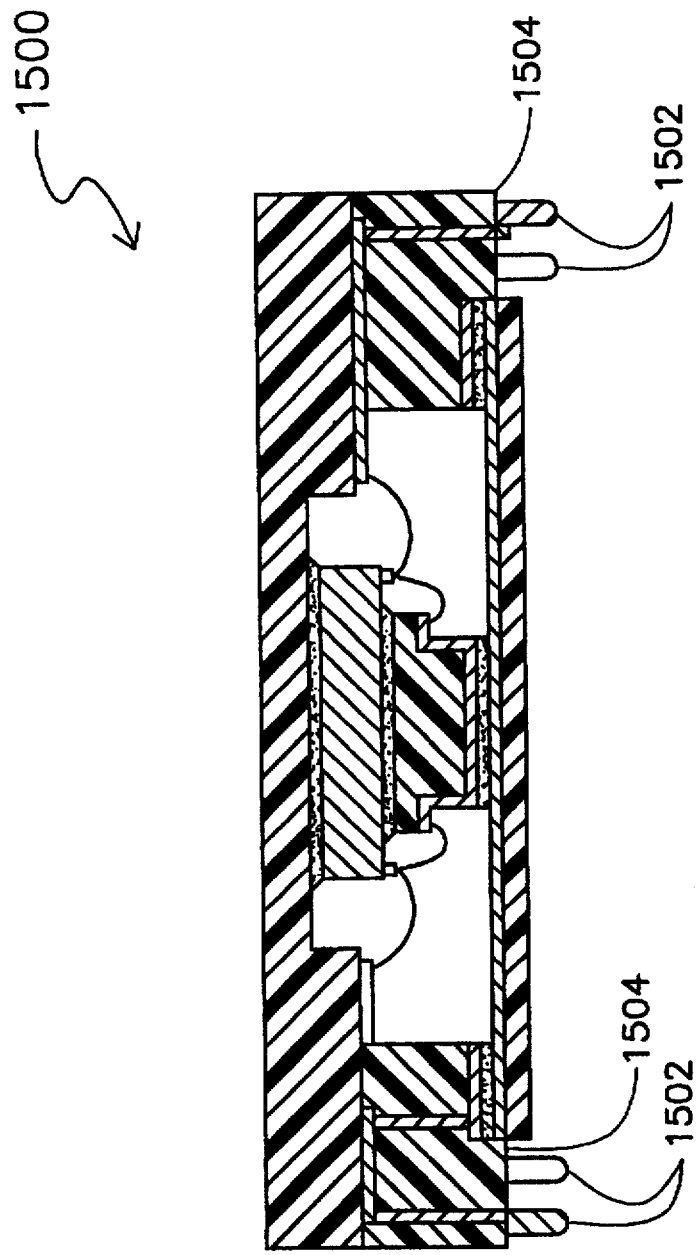
FIG. 15 is a schematic cross-section elevational view of still another embodiment of the present invention.

Referring now to FIG. 15, another embodiment of the present invention is illustrated in schematic cross-section elevational view. Here the semiconductor device assembly 1500 is in a cavity down configuration, wherein the external connectors 1502 for the bond fingers 414 and the one or more conductive case pattern(s) 416 are located on the same face 1504 of the package case 1506 which also defines the die receiving cavity 410.

Figure 16:
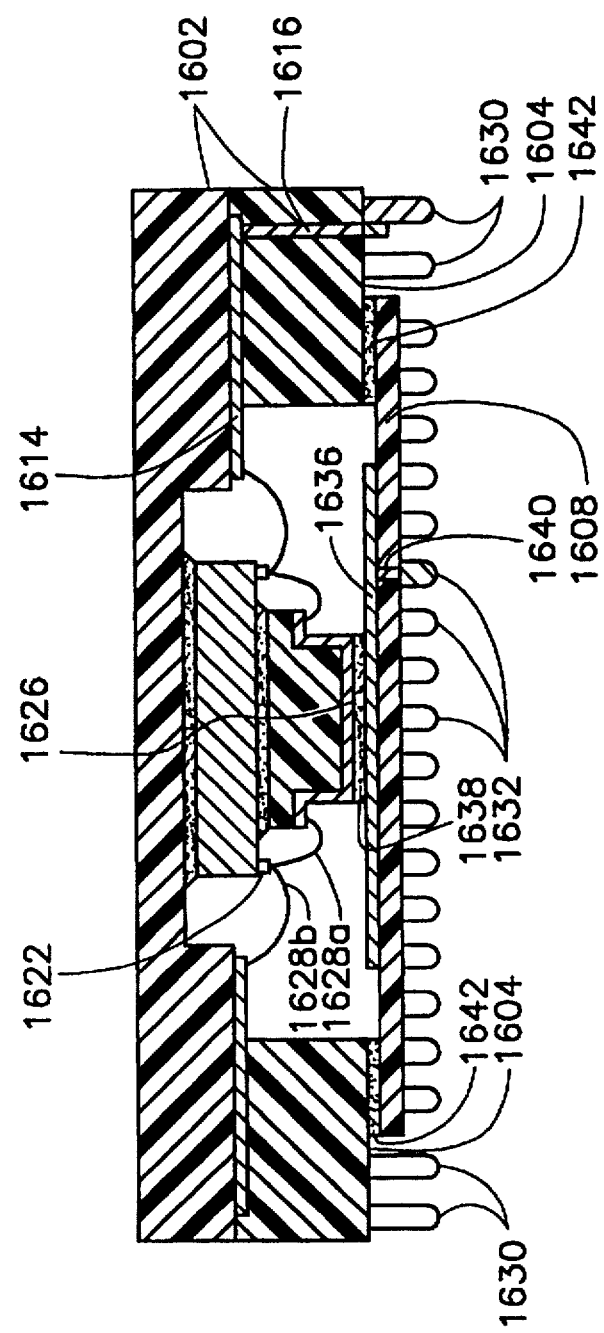
FIG. 16 is a schematic cross-section elevational view of yet another embodiment of the present invention.

Referring now to FIG. 16, another embodiment of the present invention is illustrated in schematic cross-section elevational view. Here the semiconductor device assembly 1600 is also in a cavity down configuration. Unlike the semiconductor device assembly 1500 illustrated in FIG. 15, the semiconductor device assembly 1600 has one or more external lead connectors 1632 on the exterior surface of the package lid 1608. Here one or more semiconductor die bond pads 1622 are connected to the one or more conductive platform patterns 1626 by electrical conductors 1628a, and the other remaining semiconductor die bond pads 1622 are connected to the package case bond fingers 1614 by electrical conductors 1628b. The bond fingers 1614 are further connected to external case connectors 1630 by package case vias 1616 or the like. The external case connectors 1630 surround the periphery of the package case face 1604 which defines the die receiving cavity.

The package lid 1608 has one or more conductive lid patterns 1636 on the side opposite the external lid connectors 1632. The conductive lid patterns 1636 are connected to the external lid patterns 1632 by one or more vias 1640 which pass through the package lid 1608. The conductive lid patterns 1636 are connected to the conductive platform patterns by pressure contact, reflowed solder, conductive epoxy or the like, preferably by conductive epoxy 1638. The package lid 1608 is attached to the package case 1602, preferably by a nonconductive epoxy 1642. The external lid connectors 1632 and the external case connectors 1630 are oriented to face the same direction, and preferably terminate in substantially the same plane.

Other and further objects, features and advantages will be apparent from the following description of the presently preferred embodiments of the invention, given for the purpose of disclosure and taken in conjunction with the accompanying drawings.

The present invention, therefore, is well adapted to carry out the objects and attain the ends and advantages mentioned, as well as others inherent therein. While presently preferred and most preferred embodiments of the invention have been given for purposes of disclosure, numerous changes in the details of construction, interconnection and arrangement of parts will readily suggest themselves to those skilled in the art and which are encompassed within the spirit of the invention and the scope of the appended claims.

What is claimed is:

1. A semiconductor device assembly, comprising:

a package case having at least one conductive case pattern, and a plurality of external connectors, the at least one conductive case pattern connected to at least one of the plurality of external connectors;

a semiconductor die having a plurality of bond pads, said semiconductor die attached to said package case;

a platform, said platform attached to said semiconductor die, at least one of the plurality of bond pads connected to said platform; and a package lid, said package lid connected to the at least one conductive case pattern and to said platform, thereby connecting the at least one of the plurality of bond pads to the at least one of the plurality of external connectors.

2. The semiconductor device assembly according to claim 1 wherein said platform is metal.

3. The semiconductor device assembly according to claim 1 wherein said package lid is metal.

4. A semiconductor device assembly, comprising:

a package case having a die receiving area, at least one conductive case pattern, a plurality of bond fingers, and a plurality of external connectors, the at least one conductive case pattern connected to at least one of the plurality of external connectors, the plurality of bond fingers connected to the other of the plurality of external connectors, a semiconductor die having a plurality of bond pads, said semiconductor die attached to the die receiving area of said package case;

a platform having an attachment surface, and at least one conductive platform pattern, the attachment surface attached to said semiconductor die, at least one of the plurality of bond pads connected to the at least one conductive platform pattern, at least one of the plurality of bond fingers connected to at least one of the other plurality of bond pads; and a package lid having at least one conductive lid pattern, the at least one conductive lid pattern connected to the at least one conductive case pattern and to the at least one conductive platform pattern, said package lid attached to said package case, whereby the at least one bond pad connects to the at least one of the plurality of external connectors.

5. The semiconductor device assembly according to claim 4 wherein said package case has at least two conductive case patterns, the at least two conductive case patterns each respectively connected to at least two of the plurality of external connectors, the plurality of bond fingers connected to the other of the plurality of external connectors, said platform has at least two conductive platform patterns, the at least two conductive platform patterns each respectively connected to at least two of the plurality of bond pads, and said package lid has at least two conductive lid patterns, the at least two conductive lid patterns each respectively connected to one of the at least two conductive case patterns and to one of the at least two conductive platform patterns.

6. The semiconductor device assembly according to claim 4 wherein the at least one conductive lid pattern connected to the at least one conductive case pattern and to the at least one conductive platform pattern by conductive epoxy.

7. The semiconductor device assembly according to claim 4 wherein said package case is ceramic.

8. The semiconductor device assembly according to claim 4 wherein said package case is printed circuit board.

9. The semiconductor device assembly according to claim 4 wherein said platform is ceramic.

10. The semiconductor device assembly according to claim 4 wherein said platform is printed circuit board.

11. The semiconductor device assembly according to claim 4 wherein said package lid is ceramic.

12. The semiconductor device assembly according to claim 4 wherein said package lid is printed circuit board.

13. The semiconductor device assembly according to claim 4 wherein the first conductive case pattern, the first conductive platform pattern, and the first conductive lid pattern are plated metalizations.

14. A semiconductor device assembly, comprising:

a package case having first and second case surfaces, a plurality of insulating layers, a plurality of bond fingers, a first conductive case pattern, first and second plurality of vias, and first and second plurality of external connectors, the plurality of insulating layers between the first and second case surfaces and therewith substantially coplanar, the first case surface and the plurality of insulating layers defining a die receiving cavity, one insulating layer defining a die receiving area in the die receiving cavity, the plurality of bond fingers disposed on at least one insulating layer proximate to the die receiving area, the plurality of bond fingers electrically connected to the first plurality of vias, the first plurality of vias electrically connected to the first plurality of external connectors, the first conductive case pattern disposed on the first case surface and electrically isolated from the plurality of bond fingers, the first conductive case pattern electrically connected to the second plurality of vias, the second plurality of vias electrically connected to the second plurality of external connectors;

a semiconductor die having an attachment face, an active face, a platform receiving area centrally located on the active face, and a first and second plurality of bond pads on the active face surrounding the platform receiving area, the attachment face of said semiconductor die attached to the die receiving area of said package case, the first plurality of bond pads electrically connected to the plurality of bond fingers of said package case;

a platform having an attachment surface, an interface surface substantially coplanar with the attachment surface, and a first conductive platform pattern disposed on the interface surface, the attachment surface of said platform attached to and electrically isolated from the platform receiving area of said semiconductor die, the first conductive platform pattern electrically connected to the second plurality of bond pads of said semiconductor die; and a package lid having a lid surface, a platform attachment area centrally located on the lid surface, a case attachment area peripherally located on the lid surface, and a first conductive lid pattern disposed on the lid surface and contiguously electrically connecting the platform attachment area with the case attachment area, the first conductive platform pattern electrically attached to the first conductive lid pattern in the platform attachment, the first conductive case pattern electrically attached to the first conductive lid pattern in the case attachment area, thereby sealing said semiconductor die in the die receiving cavity and electrically connecting the second plurality of bond pads of said semiconductor die to the second plurality of external connectors of said package case.

15. The semiconductor device assembly according to claim 14 wherein said first and second plurality of external connectors are located on the second case surface.

16. The semiconductor device assembly according to claim 14 wherein said first and second plurality of external connectors are located on the first case surface.

17. A semiconductor device assembly, comprising:

a package case having a plurality of external case connectors;

a semiconductor die having a plurality of bond pads, said semiconductor die attached to said package case;

a platform, said platform attached to said semiconductor die, at least one of the plurality of bond pads connected to said platform, the other of the plurality of bond pads connected to the plurality of external case connectors; and a package lid having at least one external lid connector, the at least one external lid connector connected to said platform, said package lid attached to said package case, thereby connecting the at least one of the plurality of bond pads to the at least one external connector.

\* \* \* \* \*